(12) United States Patent
Lemettre et al.

(10) Patent No.: US 11,305,983 B2
(45) Date of Patent: Apr. 19, 2022

(54) HERMETIC HOUSING COMPRISING A GETTER, OPTOELECTRONIC COMPONENT OR MEMS DEVICE INCORPORATING SUCH A HERMETIC HOUSING AND ASSOCIATED PRODUCTION METHOD

(71) Applicants: LYNRED, Palaiseau (FR); UNIVERSITE PARIS-SACLAY, Saint-Aubin (FR); CENTRE NATIONAL DE LA RECHERCHE SCIENTIFIQUE, Paris (FR)

(72) Inventors: Sylvain Lemettre, Massy (FR); David Bunel, Moirans (FR); Johan Moulin, Antony (FR); Alain Bosseboeuf, Massy (FR)

(73) Assignees: LYNRED, Palaiseau (FR); UNIVERSITE PARIS-SACLAY CENTRE NATIONAL DE LA RECHERCHE, Saint-Aubin (FR); SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 17/279,006

(22) PCT Filed: Sep. 27, 2019

(86) PCT No.: PCT/EP2019/076186
§ 371 (c)(1),
(2) Date: Mar. 23, 2021

(87) PCT Pub. No.: WO2020/094292
PCT Pub. Date: May 14, 2020

(65) Prior Publication Data
US 2022/0033250 A1 Feb. 3, 2022

(30) Foreign Application Priority Data
Nov. 8, 2018 (FR) ...................... 1860267

(51) Int. Cl.
*B81B 7/00* (2006.01)
*B81C 1/00* (2006.01)

(52) U.S. Cl.
CPC .......... *B81B 7/0038* (2013.01); *B81B 7/0067* (2013.01); *B81C 1/00285* (2013.01); *B81B 2201/0207* (2013.01)

(58) Field of Classification Search
None
See application file for complete search history.

(56) References Cited

U.S. PATENT DOCUMENTS 6,897,551 B2   5/2005   Amiotti
7,534,635 B1 *  5/2009   Foust ............... H01L 23/26
                                                       257/100

(Continued)

FOREIGN PATENT DOCUMENTS

EP   2537797 A1   12/2012
EP   2613181 A1    7/2013

OTHER PUBLICATIONS

International Search Report issued in PCT Patent Application No. PCT/EP2019/076186 dated Nov. 5, 2019.

*Primary Examiner* — Benjamin P Sandvik
(74) *Attorney, Agent, or Firm* — Marshall, Gerstein & Borun LLP

(57) ABSTRACT

A hermetic housing is disclosed (10*a*) for an optoelectronic component (11) or a MEMS device configured to form an enclosure (12) within which a low pressure or vacuum prevails. The hermetic housing includes: an optical window (14) transparent for at least one wavelength of interest ($\lambda$); and a layer of a getter material (15*a*) configured to capture gases present in said enclosure and deposited on the optical window opposite the enclosure. This layer of getter material has a thickness (e_t), greater than 60 nanometers, and a porosity (P) in the range from 10 to 70% to satisfy the (Continued)

following relation: $(1-P)*e\_t < \lambda/2\pi k$ with $\lambda$ corresponding to the at least one wavelength of interest, and k corresponding to the extinction coefficient of the material of the layer of getter material for the at least one wavelength of interest of the optical window.

8 Claims, 2 Drawing Sheets

(56) References Cited

U.S. PATENT DOCUMENTS

| | | | |
|---|---|---|---|
| 7,789,949 | B2 | 9/2010 | Sparks et al. |
| 7,998,319 | B2 | 8/2011 | Guadagnuolo et al. |
| 8,395,229 | B2 | 3/2013 | Garcia-Blanco et al. |
| 2007/0205720 | A1 | 9/2007 | Sparks et al. |
| 2008/0213539 | A1* | 9/2008 | Souriau ............... B81C 1/00285 428/156 |
| 2008/0226902 | A1* | 9/2008 | Giannantonio ........ B01J 20/103 428/336 |
| 2014/0175590 | A1 | 6/2014 | Gooch et al. |
| 2015/0014854 | A1* | 1/2015 | Gooch ................ B81C 1/00269 257/751 |
| 2015/0162479 | A1* | 6/2015 | Gooch ................ B81C 1/00373 438/72 |
| 2015/0358558 | A1* | 12/2015 | McKenzie .............. H01L 21/78 438/7 |
| 2017/0137281 | A1* | 5/2017 | Favier ................... B81B 7/0038 |

* cited by examiner

State of the art

HERMETIC HOUSING COMPRISING A GETTER, OPTOELECTRONIC COMPONENT OR MEMS DEVICE INCORPORATING SUCH A HERMETIC HOUSING AND ASSOCIATED PRODUCTION METHOD

DOMAIN OF THE INVENTION

The invention concerns a hermetic housing configured to form an enclosure within which a determined pressure prevails and intended to receive a component requiring a low pressure or vacuum for its operation. The invention also concerns an optoelectronic component or a MEMS device encapsulated in such a hermetic housing. It further concerns a method of forming such a hermetic housing.

The invention may be implemented for any type of optoelectronic component or of MEMS device for which an enclosure with a predetermined pressure is required, for example, for imaging bolometers.

BACKGROUND

To form a housing under vacuum or under a low pressure, it is known to use a pumping of the air from an enclosure, followed by the sealing of the walls forming the housing, particularly by metal welding. However, performing a metal welding generates a heating of the enclosure, causing the desorption of the gas molecules trapped on the walls of the enclosure.

When the housing is sealed, the gases present in the housing can no longer be discharged by the pumping system, so that a specific absorption device has to be positioned within the housing to remove the gases resulting from the desorption of the walls and present within said housing. Such an absorption device is called a "getter".

A getter conventionally appears in the form of a metal layer deposited on one of the walls of the housing. The getter is initially passivated. This passivation is performed by its native oxide if it has been exposed to ambient air or by a noble metal layer covering the getter or by an oxide resulting from a specific thermal treatment.

It is thus necessary to activate the getter to cause a dissolving of the native oxide or of the noble metal layer across the volume of the metal layer, then making the getter reactive.

This activation is conventionally performed by heating of the getter. Due to the heating, the atoms of the passivation layer diffuse into the metal layer of the getter and the surface of the metal layer is capable of capturing the gases present in the housing, thus lowering the pressure inside of it. The getter is then said to be "activated".

The level of vacuum reached in an enclosure is controlled by the quantity of gas molecules absorbed by the getter. This quantity depends on the activation conditions and on the properties of the getter, that is, on its chemical nature, on its microstructure, and on the extent of its surface in contact with the gases of the enclosure.

Concerning the getter activation conditions, a diffusion of atoms from the passivation layer into the volume of the getter is desired. To ease the diffusion, the getter should have a high density of grain boundaries, since the diffusion is faster through grain boundaries than within the grains. Further, during the activation, the quantity of desorbed gas increases with the anneal temperature. Thus, with a high density of grain boundaries, it is possible to limit the activation temperature of the getter and thus to limit the desorption of gas molecules into the enclosure to obtain a very low pressure.

At the same time, it is also known that an insufficiently thick getter cannot regenerate the metallic character of its surface, since the impurity atoms forming the passivation layer cannot fully diffuse into the getter. For example, document U.S. Pat. No. 7,998,319 indicates that the absorption properties of a getter are reduced when the thickness of the getter is smaller than 500 nanometers. For example, document U.S. Pat. No. 6,897,551 indicates that the absorption properties of a getter are reduced when the thickness of the getter is smaller than 100 nanometers.

Thus, to efficiently respond to the constraints of the activation conditions and of the absorption needs, it is preferable to use a layer of a getter material with a sufficient thickness, typically with a thickness greater than 60 nanometers.

Further, the quantity of absorbed gas depends on the surface area of the getter material inside of the enclosure. In the case of an optoelectronic component, the housing comprises an optical window transparent for at least one wavelength of interest of the optoelectronic component.

The presence of this optical window generally decreases the surface area useful to deposit the getter material on the inner walls of the housing. Indeed, as described in U.S. Pat. No. 8,395,229, it is conventional not to deposit the getter material on the optical window, since the presence of the getter material may degrade the quality of the optical signal transmitted through the optical window. Thus, as described in document US2014/0175590, the housings of the optoelectronic components operating under vacuum are conventionally oversized to allow the positioning of the getter material on a portion of the housing different from the optical window.

As illustrated in FIG. 1 of prior art, an optoelectronic component 11 is conventionally encapsulated in an enclosure 12 under a predetermined pressure, for example, under a pressure smaller than $10^{-3}$ mbar. Enclosure 12 is formed by the sealing of walls 17 to a substrate 13 by means of a metal sealing joint 20, thus forming a hermetic housing 100 around component 11.

To enable optoelectronic component 11 to capture external radiations, an upper portion of housing 100 is configured to comprise an optical window 14. For example, this optical window 14 may be formed by "Moth-Eyes"-type structures as described in document EP 2 613 181. Further, external radiations may also be redirected towards the rear surface of optoelectronic component 11 by means of a reflector 16, when optoelectronic component 11 is assembled in suspension on substrate 13, for example in the case of a non-cooled imaging bolometer.

The size of housing 100 is much greater than the dimensions of optoelectronic component 11 to allow the positioning of a getter material 150 next to optical window 14.

Conversely to this conventional positioning technique, the invention aims at obtaining a housing with a getter material deposited on the optical window to decrease the size of the housing with respect to the size of the optoelectronic component or to increase the surface area of the getter material.

It is known from U.S. Pat. No. 7,789,949 to use a very thin getter on a substrate transparent to radiations. To limit the influence of the presence of the getter material on the transmission of the optical signal, this document advocates the use of a getter film having a thickness smaller than 60 nanometers. More particularly, it is indicated that satisfactory results have been obtained with a getter film having a thickness smaller than 30 nanometers.

As previously described, the thickness of the getter material of document U.S. Pat. No. 7,789,949 does not always enable to efficiently respond to the constraints of the activation conditions and of the absorption needs since the thickness of the getter material is too small.

The technical issue targeted by the invention is to provide a tight housing with a layer of a getter material, deposited on an optical window, having a microstructure which enables to more efficiently respond to the constraints of the activation conditions and of the absorption needs, while allowing an efficient transmission of the optical signal.

SUMMARY

To respond to this technical problem, the invention provides depositing a layer of a getter material having a thickness of at least 60 nanometers, and having a porosity in the range from 10% to 70% to give way to a sufficient fraction of the optical signal. The invention more particularly concerns the implementation of a relation enabling to determine the way to adjust the thickness and the porosity to obtain an efficient getter while limiting the impact on the optical signal according to the nature of the getter material, that is, according to its absorption coefficient and to its extinction coefficient.

For this purpose, according to a first aspect, the invention concerns a hermetic housing for an optoelectronic component or a MEMS device configured to form an enclosure within which a low pressure or vacuum prevails, said hermetic housing comprising:

an optical window transparent for at least one wavelength of interest of said optoelectronic component or of the MEMS device; and a layer of a getter material configured to capture gases present in said enclosure, said layer being deposited on the optical window opposite said enclosure.

The invention is characterized in that the layer of getter material comprises a thickness $e_t$, greater than 60 nanometers, and a porosity P in the range from 10% to 70%, thickness $e_t$ and porosity P being configured to satisfy the following relation:

$$(1-P)*e_t < \frac{\lambda}{2\pi k}$$

with:
$\lambda$ corresponding to said at last one wavelength of interest of the optical window, and
k corresponding to the extinction coefficient of the material of said layer of getter material for said at least one wavelength of interest of the optical window.

In this equation:
the expression $(1-P)*e_t$ represents the equivalent thickness of material crossed by a light ray;
the expression $$\frac{\lambda}{2\pi k}$$

represents the maximum thickness that the light ray can cross before being considered as attenuated. This expression refers to the extinction coefficient of the solid material. This extinction coefficient may be found in different publications according to the considered wavelength. For example, by using Brendel-Bormann's 1998 model, the extinction coefficient of titanium is 14.628 for a 8-micromter wavelength and 23.941 for a 14-micrometer wavelength. Lorentz-Drude's 1998 model provides titanium extinction coefficients of 14.794 and 24.007 for the two considered wavelengths.

Further, this extinction coefficient is directly linked to the attenuation coefficient $\alpha$ of the considered material by the following relation:

$$k = \alpha \cdot \frac{\lambda}{4\pi}$$

This attenuation coefficient may also be found in publications of the type of those previously indicated.

The invention thus enables to set the thickness and the porosity to obtain an efficient getter while limiting the impact on the optical signal. Indeed, if the porosity is too high, typically greater than 70%, the getter walls are no longer sufficiently thick to perform an absorption of the molecules present in the enclosure. Conversely, if the porosity is too low, typically lower than 10%, the getter appears in the form of a solid material, and its thickness is too large to guarantee an efficient transmittance at the level of the optical window in the wavelength of interest. To guarantee the transmittance, the relation linking the porosity to the thickness should be smaller than $$\frac{\lambda}{2\pi k}.$$

Conventionally, the pores of the getter material are made of vacuum and of air, but in the context of the invention, they may also be made of any other material transparent for said at least one wavelength of interest. For example, the pores may be silicon, if the wavelengths of interest are the infrared radiations (8-14 µm).

In the sense of the invention, porosity P corresponds to the ratio of the weight of the getter material implemented in the invention to the weight of a specific volume of the same material corresponding to the volume of said getter material. Thus, to determine the porosity of a layer of getter material, the nature of the getter material should be determined and the volume and the weight of the layer of the getter material should be measured. Then, the nature of the getter material may be used to form a new layer of solid material with a volume corresponding to the measured volume; By measuring the weight of this layer of solid material, it is possible to determine the porosity by dividing the weight of the layer of getter material by the weight of the layer of solid material.

As a result, it is possible to size the housing at closest to the dimensions of the optoelectronic component or of the MEMS device, since it is no longer necessary to use a portion of the housing distant from the optical window to have the layer of getter material. As a variant, by using a housing of conventional size, it is possible to increase the surface area of the layer of getter material and, thus, to decrease the pressure in the enclosure after activation of the getter.

To increase the surface area of getter contact with the gases present in the enclosure, the layer of getter material may have a base topped with a structuring pattern, the thickness of said base being greater than 60 nanometers.

In this embodiment, the thickness of the base guarantees the absorption of the molecules of the passivation layer (native oxide) during the getter activation and the structuring pattern enables to increase the gas volume captured by the getter.

Typically, the layer of getter material may be configured to guarantee a pressure smaller than $10^{-3}$ mbar in the enclosure.

This embodiment enables to reach a maximum sensitivity for imaging bolometers, and in particular for non-cooled micro-bolometers in the field of infrared imaging.

The layer of getter material may be made of zirconium, of titanium, of vanadium, of hafnium, of niobium, of tantalum, of cobalt, of yttrium, of barium, of iron, or of an alloy of these materials. Further, chromium (Cr), aluminum (Al), nickel (Ni), and rare earths such as cerium (Ce), cesium (Cs), or lanthanum (La) may be added to these metals to improve the characteristics of the getter, such as the grain size, the free oxide formation enthalpy, or the catalytic activity for the cracking of the gas molecules.

Such metals enable to obtain the desired absorption properties. Of course, the invention is not limited to the use of these materials and all transition metals, plus barium and aluminum, may be used as a getter.

This embodiment enables the surface of the getter material to have a reactive character with respect to gas molecules, to keep this reactive character after the chemisorption of the gas molecules, and to obtain a surface with a microstructure favorable to the absorption of gases in the enclosure.

According to a second aspect, the invention concerns an optoelectronic component or a MEMS device comprising a hermetic housing according to the first aspect of the invention.

According to a third aspect, the invention concerns a method of manufacturing an optoelectronic component or a MEMS device according to the second aspect of the invention, said method comprising a step of deposition by evaporation or sputtering of a layer of getter material formed under incidence of said optical window with respect to a flux generated by an evaporation or sputtering element of said layer of getter material.

The method of deposition of a layer of getter material is conventionally implemented by evaporation or by sputtering with an incident flux of atoms deposited according to an angle normal to the deposition surface.

If the angle between the deposition surface and the normal to the flux generated by the evaporation or sputtering element is sufficiently large, typically from 40 to 80°, an effect of shadowing of the flux of incident atoms by the deposited germs occurs, resulting in the growth of nanostructure columnar films, having a large effective surface area. Thus, the forming of a deposition under incidence enables to adjust the porosity of the layer of getter material according to the desired needs.

Further, the deposition surface may be rotated during the deposition to modify the structure of the nanostructured columnar films. As a result, it is possible to adjust the porosity of the layer of getter material by varying the angle of incidence of the atom flux, the rotation speed of the deposition surface and, in the case of a deposition with the cathode sputtering technique, the pressure of the carrier gas. These different parameters enable to obtain various columnar structures, such as pillars, zigzags, square spirals or helixes.

BRIEF DESCRIPTION OF THE DRAWINGS

The way to implement the present invention, as well as the resulting advantages, will better appear from the description of the following non-limiting embodiments, given as an indication, based on the accompanying drawings, among which

FIG. 1—state of the art: simplified cross-section view of an optoelectronic component encapsulated in a housing where a getter is arranged on an upper wall of the enclosure next to an optical window;

FIG. 4: simplified view of a step of deposition under incidence of the getter of FIG. 2.

DETAILED DESCRIPTION

In the following description, the invention will be described in reference to an optoelectronic component 11 although the invention may also apply to a MEMS device without changing the invention.

Figure 1:
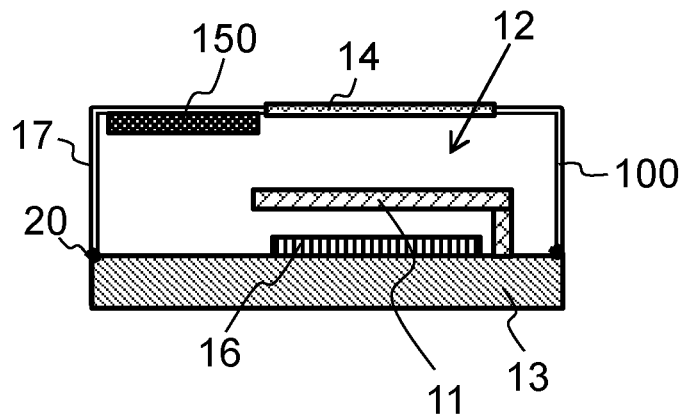
FIGS. 1 and 4 show.
Figure 2:
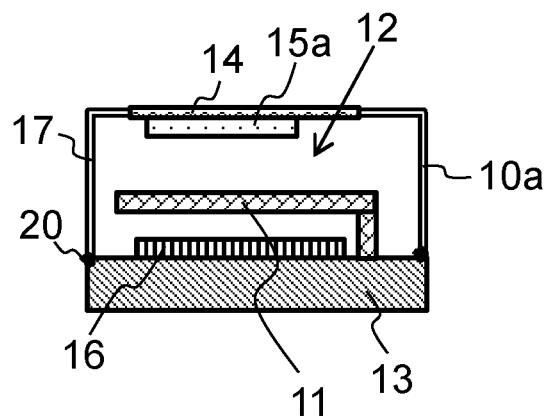
FIG. 2: simplified cross-section view of an optoelectronic component encapsulated in a housing according to a first embodiment of the invention where the getter is only arranged on an optical window.

FIG. 2 illustrates an optoelectronic component 11 encapsulated in an enclosure 12 under a predetermined pressure, for example, under a pressure smaller than $10^{-3}$ mbar. Enclosure 12 is formed by the sealing of walls 17 to a substrate 13 by means of a metal sealing joint 20, thus forming a hermetic housing 10a around optoelectronic component 11.

The invention is described, considering that optoelectronic component 11 corresponds to a microbolometer assembled in suspension on a substrate 13. As a variant, other optoelectronic components 11 intended to operate in a controlled atmosphere may be used without modifying the scope of the invention.

Microbolometer 11 has a bolometric membrane arranged in suspension on substrate 13. This bolometric membrane is configured to capture infrared radiations with a wavelength in the range from 8 to 14 micrometers.

The infrared radiations are transmitted from the outside of the housing and filtered by an optical window 14 to filter radiations having a wavelength smaller than 8 micrometers since these wavelengths would dazzle microbolometer 11.

For example, the filtering may be formed by thin optical layers deposited on the two surfaces of optical window 14 or by etching "Moth-Eye" structures, such as described in document EP2613181, on the portion of the upper wall of housing 10 forming optical window 14.

Further, the infrared radiations may also be redirected onto the rear surface of the bolometric membrane by means of a reflector 16 deposited on substrate 13 and under the bolometric membrane.

Figure 3:
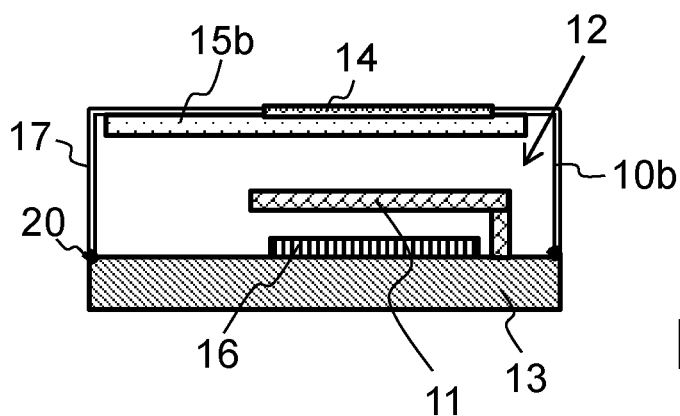
FIG. 3: simplified cross-section view of an optoelectronic component encapsulated in a housing according to a second embodiment of the invention where the getter is arranged on an upper wall of the enclosure and on an optical window.

In the embodiment of FIG. 2, the layer of getter material 15a of housing 10a is only deposited on optical window 14, thus enabling to obtain a housing 10a, having dimensions adapted to the dimensions of optoelectronic component 11. As a variant, as illustrated in FIG. 3, the layer of getter material 15b may also extend on an upper wall of housing 10b which does not form optical window 14 to increase the surface area of getter material 15b.

In these two embodiments, conversely to conventional implementations, a layer of a getter material 15a, 15b is deposited on optical window 14 to capture the gases present in enclosure 12 after the activation of the getter.

According to the invention, getter 15a has a thickness $e_t$ greater than 60 nanometers and a porosity P in the range from 10% to 70%. Thickness $e_t$ and porosity P are configured to satisfy the following relation:

$$(1-P)*e_t < \frac{\lambda}{2\pi k}$$

with λ corresponding to said at least one wavelength of interest of optical window 14, and k corresponding to the extinction coefficient of the material of the layer of getter material 15a, 15b for the wavelength of interest.

In the case where optical window 14 covers a wavelength range of interest, typically for the wavelength range from 8 to 14 micrometer, thickness $e_t$ and porosity P are configured to satisfy this relation for all the wavelengths in the range of optical window 14. The pores may be formed of vacuum, of air, or of any other material transparent in the wavelengths of interest.

The layer of getter material 15a, 15b may be made of zirconium (Zr), of titanium (Ti), of vanadium (V), of hafnium (Hf), of niobium (Nb), of tantalum (Ta), of cobalt (Co), of iron (Fe), of yttrium (Y), of barium (Ba), or of an alloy of these materials. Further, aluminum (Al), nickel (Ni), and rare earths such as chromium (Cr), cerium (Ce), cesium (Cs), or lanthanum (La) may be added to these metals to improve the characteristics of the layer of getter material 15a, 15b, such as the grain size, the free oxide formation enthalpy, or the catalytic activity for the cracking of the gas molecules.

Figure 4:
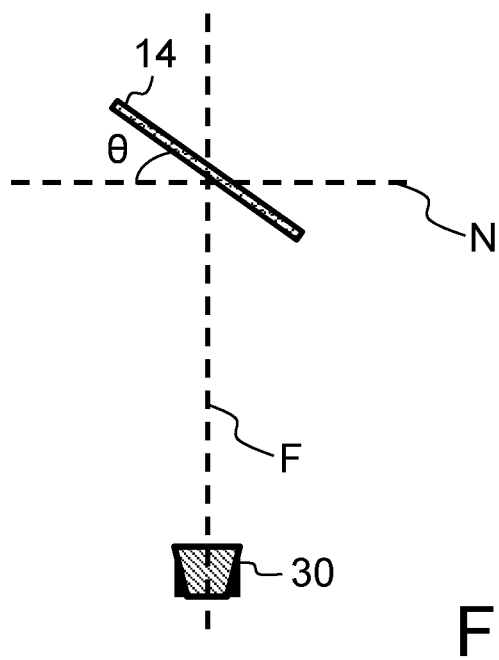

To obtain the desired porosity, the deposition of getter material 15a, 15b may be performed by evaporation or sputtering under incidence from an evaporation or sputtering element 30, as illustrated in FIG. 4. For example, element 30 may formed of a crucible in the case of a deposition by evaporation.

In the sense of the invention, a deposition under incidence corresponds to a deposition where the incidence angle θ between optical window 14 and the normal N to the generated flux F is greater than 10° as opposed to conventional methods where the deposition surface is coplanar with normal N. Preferably, the incidence angle θ between optical window 14 and the normal N to the generated flux F is in the range from 40° to 80° to use shadowing effects to create patterns having high porosities.

To structure the porosities, it is also possible to use a permanent or intermittent rotation of optical window 14 during the deposition of getter material 15a, 15b.

This embodiment thus enables to obtain a getter 15a, 15b having a thickness $e_t$ and a porosity P satisfying equation:

$$(1-P)*e_t < \frac{\lambda}{2\pi k}$$

For example, with a titanium getter film deposited by oblique evaporation with a permanent rotation at 5 rpm under a 60° incidence to reach a 157-nm thickness, a 52% porosity has been obtained.

According to this first example, expression $(1-P)*e_t$ represents a value of $7.54 \cdot 10^{-8}$. For the 8-micrometer wavelength, titanium has an extinction coefficient k of 14.8, using Lorentz-Drude's 1998 model. The expression $$\frac{\lambda}{2\pi k}$$

thus represents a value or $8.60 \cdot 10^{-8}$. The equation of the invention is thus respected since $7.54 \cdot 10^{-8} < 8.60 \cdot 10^{-8}$. For the 14 micrometer wavelength, titanium has an extinction coefficient k of 24.0, using Lorentz-Drude's 1998 model. The expression $$\frac{\lambda}{2\pi k}$$

thus represents a value of $9.28 \cdot 10^{-8}$ and the equation of the invention is also respected since $7.54 \cdot 10^{-8} < 9.28 \cdot 10^{-8}$.

For a second example, with a titanium getter film deposited by oblique evaporation with intermittent rotations of 6 seconds every 18 seconds under a 60° incidence to reach a 151-nm thickness, a 60% porosity has been obtained.

According to this second example, expression $(1-P)*e_t$ represents a value of $6.04 \cdot 10^{-8}$. The equation of the invention is thus respected for wavelengths between 8 and 14 micrometers since $6.04 \cdot 10^{-8} < 8.60 \cdot 10^{-8}$ and $6.04 \cdot 10^{-8} < 9.28 \cdot 10^{-8}$.

The invention thus enables to set the thickness and the porosity to obtain an efficient getter while limiting the impact on the optical signal. As a result, the invention enables to position a getter on an optical window while allowing an efficient transmission of the optical signal.

The invention claimed is:

1. A hermetic housing for an optoelectronic component or a MEMS device configured to form an enclosure within which a low pressure or vacuum prevails, said hermetic housing comprising:
   an optical window transparent for at least one wavelength of interest of said optoelectronic component or of the MEMS device; and
   a layer of a getter material configured to capture gases present in said enclosure and deposited on said optical window opposite said enclosure;
   wherein the layer of getter material has a thickness ($e_t$) greater than 60 nanometers and a porosity (P) in the range from 10% to 70%; the thickness ($e_t$) and the porosity (P) being configured to satisfy the following relation:

$$(1-P)*e_t < \frac{\lambda}{2\pi k}$$

with λ corresponding to said at least one wavelength of interest of the optical window, and k corresponding to the extinction coefficient of the material of the layer of getter material for said at least one wavelength of interest of the optical window.

2. Hermetic housing according to claim 1, wherein the layer of getter material has a base topped with a structuring pattern, the thickness of said base being greater than 60 nanometers.

3. Hermetic housing according to claim 1, wherein the layer of getter material is made of zirconium (Zr), of titanium (Ti), of vanadium (V), of hafnium (Hf), of niobium (Nb), of tantalum (Ta), of cobalt (Co), of yttrium (Y), of barium (Ba), of iron (Fe), or of an alloy of these materials.

4. Hermetic housing according to claim 3, wherein the layer of getter material is further formed with rare earths or aluminum (Al), or nickel (Ni).

5. Optoelectronic component or MEMS device comprising a hermetic housing according to claim 1.

6. Method of manufacturing an optoelectronic component or a MEMS device according to claim 5, said method comprising a step of deposition by evaporation or sputtering of a layer of a getter material formed under incidence of said optical window with respect to a flux (F) generated by an evaporation or sputtering element of said layer of getter material.

7. Manufacturing method according to claim 6, wherein said deposition step is carried out while said optical window is rotating with respect to said evaporation or sputtering element.

8. Manufacturing method according to claim 6, wherein said deposition step is carried out with an incidence angle (θ) in the range from 40 to 80° between said optical window and the normal (N) to the flux (F) generated by said evaporation or sputtering element.

\* \* \* \* \*